(12) United States Patent
Lee et al.

(10) Patent No.: US 9,202,813 B2
(45) Date of Patent: Dec. 1, 2015

(54) ELECTRODE STRUCTURE, METHOD OF FABRICATING THE SAME, AND SEMICONDUCTOR DEVICE INCLUDING THE ELECTRODE STRUCTURE

(75) Inventors: Dong-kak Lee, Seoul (KR); Joon Kim, Seoul (KR); Bong-hyun Kim, Incheon (KR); Han-Jin Lim, Seoul (KR)

(73) Assignee: SAMSUNG ELECTRONICS CO., LTD., Samsung-ro, Yeontong-gu, Suwon-si, Gyeonggi-do (KR)

( * ) Notice: Subject to any disclaimer, the term of this patent is extended or adjusted under 35 U.S.C. 154(b) by 728 days.

(21) Appl. No.: 13/169,348

(22) Filed: Jun. 27, 2011

(65) Prior Publication Data

US 2012/0001267 A1  Jan. 5, 2012

(30) Foreign Application Priority Data

Jul. 2, 2010  (KR) ........................ 10-2010-0063871

(51) Int. Cl.
| | |
|---|---|
| H01L 21/28 | (2006.01) |
| H01L 21/311 | (2006.01) |
| H01L 27/108 | (2006.01) |
| H01L 21/8238 | (2006.01) |
| H01L 29/10 | (2006.01) |
| H01L 29/423 | (2006.01) |
| H01L 29/49 | (2006.01) |
| H01L 29/66 | (2006.01) |
| H01L 29/78 | (2006.01) |

(52) U.S. Cl.
CPC .... *H01L 27/10873* (2013.01); *H01L 21/28061* (2013.01); *H01L 21/823842* (2013.01); *H01L 29/1037* (2013.01); *H01L 29/4236* (2013.01); *H01L 29/4925* (2013.01); *H01L 29/4941* (2013.01); *H01L 29/66575* (2013.01); *H01L 29/78* (2013.01)

(58) Field of Classification Search
CPC .. H01L 27/14614; H01L 21/28; H01L 21/311
USPC ............................................. 257/64; 438/488
See application file for complete search history.

(56) References Cited

U.S. PATENT DOCUMENTS

| | | | |
|---|---|---|---|
| 2004/0002185 A1* | 1/2004 | Takahashi | 438/224 |
| 2007/0099365 A1* | 5/2007 | Lim et al. | 438/197 |
| 2007/0102748 A1* | 5/2007 | Tseng et al. | 257/314 |
| 2008/0048277 A1* | 2/2008 | Kim et al. | 257/412 |

FOREIGN PATENT DOCUMENTS

| | | |
|---|---|---|
| JP | 08-264774 | 10/1996 |
| JP | 11-243065 | 9/1999 |
| KR | 10-0586554 B1 | 5/2006 |

* cited by examiner

*Primary Examiner* — Mohammad Choudhry
(74) *Attorney, Agent, or Firm* — Muir Patent Law, PLLC

(57) ABSTRACT

An electrode structure is disclosed. The electrode structure includes a first polysilicon layer doped with resistance adjustment impurities; a second polysilicon layer for adjusting grains, formed in the first polysilicon layer and doped with grain adjustment impurities; an ohmic metal layer formed on the first and second polysilicon layers; a barrier metal layer formed on the ohmic metal layer; and a metal layer formed on the barrier metal layer.

16 Claims, 12 Drawing Sheets

ELECTRODE STRUCTURE, METHOD OF FABRICATING THE SAME, AND SEMICONDUCTOR DEVICE INCLUDING THE ELECTRODE STRUCTURE

CROSS-REFERENCE TO RELATED APPLICATIONS

This application claims the benefit of priority to Korean Patent Application No. 10-2010-0063871, filed on Jul. 2, 2010, in the Korean Intellectual Property Office, the disclosure of which is incorporated herein in its entirety by reference.

BACKGROUND

The disclosed embodiments relate to an electrode structure, a method of fabricating the electrode structure, and a semiconductor device including the electrode structure.

As semiconductor devices become highly integrated, electrode structures including the semiconductor devices benefit from maintaining low resistances. The electrode structures should be easily fabricated through a process of fabricating the semiconductor devices. It is desirable for the electrode structures including the semiconductor devices to have a low reactivity with other material layers, for example, polysilicon layers or metal layers. In addition, it is desirable to prevent impurities contained in the electrode structures including the semiconductor devices from diffusing over to semiconductor substrates.

SUMMARY

The disclosed embodiments provide an electrode structure having a low resistance and capable of preventing impurities contained therein from diffusing, and further capable of inhibiting reactivity with another material layer.

The disclosed embodiments also provide a method of fabricating an electrode structure capable of increasing a manufacturing process' degrees of freedom.

The disclosed embodiments additionally provide a semiconductor device using the above-described electrode structure.

According to one embodiment, there is provided an electrode structure including: a first polysilicon layer doped with resistance adjustment impurities; and a second polysilicon layer for adjusting grains, formed on the first polysilicon layer doped with the resistance adjustment impurities and additionally doped with grain adjustment impurities. The electrode structure further includes an ohmic metal layer formed on the first and second polysilicon layers; a barrier metal layer formed on the ohmic metal layer; and a metal layer formed on the barrier metal layer.

The second polysilicon layer may be disposed between the first polysilicon layer and the ohmic metal layer. The second polysilicon layer may be uniformly formed on the first polysilicon layer. The second polysilicon layer may be formed in a specific level of the first polysilicon layer. The second polysilicon layer may be uniformly formed in the first polysilicon layer.

In one embodiment, the second polysilicon layer is formed in the entire first polysilicon layer so that the second polysilicon layer and the first polysilicon layer are formed as a single polysilicon layer. The grain adjustment impurities doped in the second polysilicon layer may be one or more of carbon, nitrogen, and oxygen. The ohmic metal layer may be a metal silicide layer.

According to another aspect of the disclosed embodiments, there is provided a method of fabricating an electrode structure, the method including: forming a polysilicon layer doped with resistance adjustment impurities on a semiconductor substrate, the polysilicon layer including a first polysilicon layer including the resistance adjustment impurities as the only impurities; forming a second polysilicon layer for adjusting grains and doped with grain adjustment impurities in the polysilicon layer doped with the resistance adjustment impurities; forming an ohmic metal layer on the second polysilicon layer; forming a barrier metal layer on the ohmic metal layer; and forming a metal layer on the barrier metal layer.

The second polysilicon layer may be formed on the polysilicon layer by in-situ depositing a precursor including one or more of carbon, nitrogen, and oxygen. The second polysilicon layer may be formed by doping one or more of carbon, nitrogen, and oxygen through an epitaxial growth process.

According to another aspect of the disclosed embodiments, there is provided a semiconductor device including: a semiconductor substrate including a p-type metal-oxide-semiconductor (PMOS) region and an n-type metal-oxide-semiconductor (NMOS) region; a first gate stack formed on the PMOS region of the semiconductor substrate and comprising a first electrode structure; and a second gate stack formed on the NMOS region of the semiconductor substrate and comprising a second electrode structure.

Each of the first electrode structure and the second electrode structure includes: a polysilicon layer doped with resistance adjustment impurities; a polysilicon layer for adjusting grains formed in the polysilicon layer doped with the resistance adjustment impurities and doped with grain adjustment impurities; an ohmic metal layer formed on the polysilicon layer including the polysilicon layer for adjusting the grain; a barrier metal layer formed on the ohmic metal layer; and a metal layer formed on the barrier metal layer, wherein the existence of the polysilicon layer for adjusting the grain results in a reduced difference in the thickness between the ohmic metal layer of the first electrode structure and the ohmic metal layer of the second electrode structure.

The first gate stack may include a first gate insulation layer formed on the semiconductor substrate, a first polysilicon layer formed on the first gate insulation layer and doped with P type impurities, and a first polysilicon layer for adjusting the grain, formed in the first polysilicon layer doped with the P type impurities, wherein the first electrode structure comprises a first ohmic metal layer formed on the first polysilicon layer for adjusting the grain.

The P type impurities may be inhibited from diffusing over to the semiconductor substrate due to the first polysilicon layer for adjusting the grain.

The second gate stack may include a second gate insulation layer formed on the semiconductor substrate, a second polysilicon layer formed on the second gate insulation layer and doped with N type impurities, and a second polysilicon layer for adjusting the grain formed in the second polysilicon layer, wherein a second electrode structure comprises a second ohmic metal layer formed on the second polysilicon layer for adjusting the grain.

The thickness of the second ohmic metal layer included in the second electrode structure may be reduced due to the second polysilicon layer for adjusting the grain. The first ohmic metal layer and the second ohmic metal layer may be silicide layers.

The polysilicon layer for adjusting the grain may be doped with one or more of carbon, nitrogen, and oxygen. The first electrode structure and the second electrode structure may be gate electrodes or word lines.

According to another embodiment, there is provided a semiconductor device including: a plurality of gate stacks formed on a semiconductor substrate; an impurity region formed on the semiconductor substrate between the plurality of gate stacks; and a pad electrode formed between the plurality of gate stacks on the impurity regions and comprising an electrode structure.

The electrode structure included in the pad electrode may include: a first polysilicon layer; a second polysilicon layer, formed in the first polysilicon layer and doped with grain adjustment impurities; an ohmic metal layer formed on the second polysilicon layer; a barrier metal layer formed on the ohmic metal layer; and a metal layer formed on the barrier metal layer.

Each of the plurality of gate stacks may include a gate insulation layer, a gate electrode, and a gate cap layer, the gate insulation layer being formed in a recess channel trench formed by etching the semiconductor substrate, and the gate electrode being formed on the gate insulation layer formed in the recess channel trench and on the semiconductor substrate.

The second polysilicon layer included in the electrode structure included in the pad electrode may be disposed between the ohmic metal layer and a portion of the first polysilicon layer that includes impurities consisting only of the resistance adjustment impurities. The ohmic metal layer may be a metal silicide layer. The second polysilicon layer included in the electrode structure included in the pad electrode may be formed in a specific level of the first polysilicon layer. The second polysilicon layer included in the electrode structure included in the pad electrode may be formed in the entire of the first polysilicon layer.

Each of the plurality of gate stacks may include a gate insulation layer, a gate electrode, and a gate cap layer, the electrode structure comprising a polysilicon layer doped with resistance adjustment impurities; a polysilicon layer for adjusting grains, formed in the polysilicon layer doped with the resistance adjustment impurities and doped with grain adjustment impurities; an ohmic metal layer formed on the polysilicon layer including the polysilicon layer for adjusting the grain; a barrier metal layer formed on the ohmic metal layer; and a metal layer formed on the barrier metal layer.

According to another embodiment, there is provided a semiconductor device including: a plurality of gate stacks formed on a semiconductor substrate and acting as a plurality of word lines; an impurity region formed on the semiconductor substrate between the plurality of gate stacks; a direct contact (DC) pad electrode and a burying contact (BC) pad electrode formed between the plurality of gate stacks on the impurity regions and comprising an electrode structure; and bit lines and capacitors connected to the DC pad electrode and the BC pad electrode, respectively.

The electrode structure included in the DC pad electrode and the BC pad electrode may include: a polysilicon layer doped with resistance adjustment impurities; a polysilicon layer for adjusting grains, formed in the polysilicon layer doped with the resistance adjustment impurities and doped with grain adjustment impurities; an ohmic metal layer formed on the polysilicon layer including the polysilicon layer for adjusting the grain; a barrier metal layer formed on the ohmic metal layer; and a metal layer formed on the barrier metal layer.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
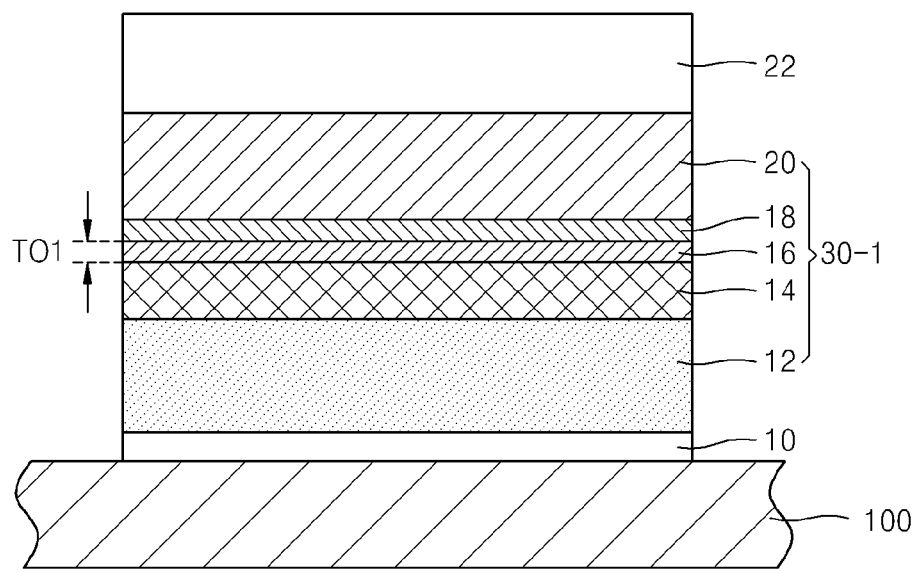
FIG. 1 is a schematic cross-sectional view for explaining an electrode structure and a method of fabricating the electrode structure, according to an exemplary embodiment.

The disclosure will now be described more fully with reference to the accompanying drawings, in which exemplary embodiments are shown. The inventive concept may, however, be embodied in many different forms and should not be construed as being limited to the embodiments set forth herein. Like reference numerals in the drawings denote like elements, and thus their description will be omitted. In the drawings, the thicknesses of layers and regions are exaggerated for clarity.

The terminology used herein is for describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept. Further, the term "same" as used herein when referring to shapes, sizes, amounts, or other measures does not necessarily mean exactly the same, but is intended to encompass nearly identical measures within acceptable variations that may occur, for example, due to manufacturing processes.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross-sectional or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an edge or corner region illustrated as having sharp edges may have somewhat rounded or curved features. Likewise, elements illustrated as circular or spherical may be oval in shape or may have certain straight or flattened portions. Thus, the regions illustrated in the figures are schematic in nature and their shapes as shown in the figures are not intended to limit the scope of the disclosed embodiments.

Unless otherwise defined, all terms (including technical and scientific terms) used herein have the same meaning as commonly understood in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
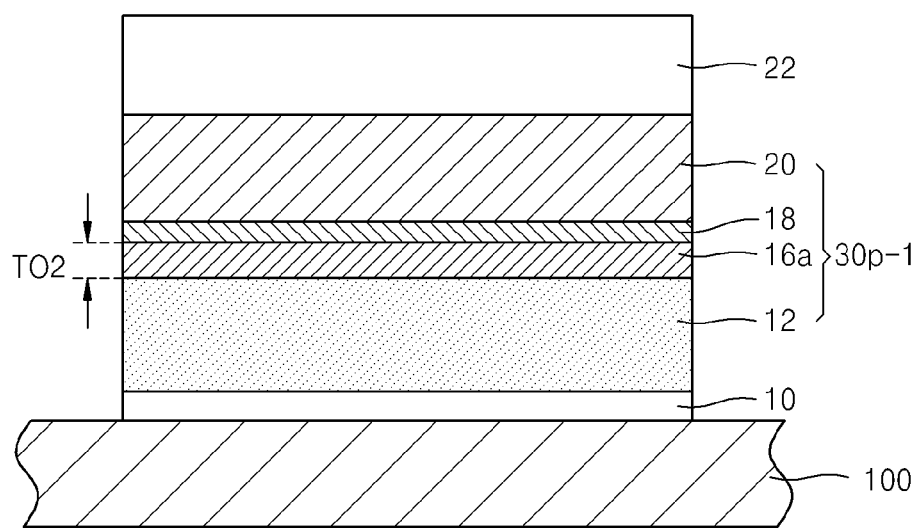
FIG. 2 is a schematic cross-sectional view of an electrode structure as a comparative example related to FIG. 1.

First Embodiment of Electrode Structure and Method of Fabricating the Electrode Structure FIG. 1 is a schematic cross-sectional view for explaining an electrode structure 30-1 and a method of fabricating the electrode structure 30-1, according to an exemplary embodiment. FIG. 2 is a schematic cross-sectional view of an electrode structure 30p-1 as a comparative example related to FIG. 1.

In more detail, the electrode structure 30-1 of the present embodiment and the electrode structure 30p-1 of the comparative example will now be described. A gate insulation layer 10 is formed on a semiconductor substrate 100, for example, a silicon substrate. The electrode structures 30-1 and 30p-1 are formed on the gate insulation layer 10. A gate cap layer 22 is formed on the electrode structures 30-1 and 30p-1.

In one embodiment, the electrode structure 30-1 includes a polysilicon layer 12 doped with resistance adjustment impurities, a polysilicon layer 14 for adjusting grains and doped with grain adjustment impurities, an ohmic metal layer 16, a barrier metal layer 18, and a metal layer 20 that are sequentially formed on the gate insulation layer 10. In one embodiment, the polysilicon layer 14 for adjusting the grain is directly adjacent to the polysilicon layer 12 and is disposed between the polysilicon layer 12 and the ohmic metal layer 16.

The polysilicon layer 14 for adjusting the grain includes impurities that cause the grain size of grains in the polysilicon layer 14 to vary compared to the grain size of grains in the polysilicon layer 12. For example, in one embodiment, the polysilicon layers 12 and 14 include the same polysilicon materials and the same resistance adjustment impurities, but the polysilicon layer 14 includes additional grain adjustment impurities that cause the grain size of grains in polysilicon layer 14 to be on average smaller than the grain size of grains in the polysilicon layer 12. The polysilicon layer 14 may be formed on the polysilicon layer 12 doped with resistance adjustment impurities by in-situ depositing a precursor including grain adjustment impurities including, for example, one or more of carbon, nitrogen, and oxygen. When the grain adjustment impurities are carbon, for example, the polysilicon layer 14 for adjusting the grain may be formed by in-situ depositing a precursor including $SiH_3CH_3$ and $Si_2H_6$ (or $SiH_2Cl_2$) or a precursor including $SiH_4$ and $C_2H_4$ (or $SiH_3CH_3$). When the grain adjustment impurities are oxygen, for example, the polysilicon layer 14 for adjusting the grain may be formed by in-situ depositing a precursor including $N_3O$ and $Si_2H_2$ or a precursor including $SiH_4$ and $N_2O$. When the grain adjustment impurities are nitrogen, for example, the polysilicon layer 14 for adjusting the grain may be formed by in-situ depositing a precursor including $NH_3$ and $S_2H_6$ or a precursor including $SiH_4$ and $NH_3$. Furthermore, the polysilicon layer 14 for adjusting the grain may be doped with grain adjustment impurities while forming a polysilicon layer through an epitaxial growth process.

The polysilicon layer 14 for adjusting the grain may be formed by in-situ depositing a precursor including the grain adjustment impurities or through the epitaxial growth process so that the polysilicon layer 14 for adjusting the grain is uniformly formed on the polysilicon layer 12 doped with resistance adjustment impurities. The uniform forming of the polysilicon layer 14 for adjusting the grain can improve the beneficial effects of the disclosed embodiments.

The electrode structure 30p-1 of the comparative example includes the polysilicon layer 12 doped with resistance adjustment impurities, an ohmic metal layer 16a, the barrier metal layer 18, and the metal layer 20 that are sequentially formed on the gate insulation layer 10. The electrode structure 30-1 further includes the polysilicon layer 14 for adjusting the grain, unlike the electrode structure 30p-1 of the comparative example.

Each of metal layer 20, barrier metal layer 18, and ohmic metal layers 16 and 16a may be referred to as metal material layers, and may include metal material. For example, the metal material layers may include pure metals or metal alloys (e.g., copper, tungsten, titanium), or metal silicides, metal nitrides, or other compounds that include metal elements. The metal layer 20 included in the electrode structures 30-1 and 30p-1 is used to reduce the resistance of the electrode structure 30-1. The ohmic metal layers 16 and 16a are used for an ohmic contact between a metal material layer and a semiconductor material layer, for example, a polysilicon layer. The barrier metal layer 18 may have a high conductivity to maintain a highly conductive electrical contact between upper and lower metal material layers, and also serves a barrier to diffusion to prevent metal material from diffusing from the metal layer 20 to the polysilicon material layers. As such, the barrier metal layer 18 may comprise a metal material that is highly conductive and provides a low rate of diffusion, and may assist in isolating the metal layer 20 from the polysilicon layers 12 and 14.

In one embodiment, the ohmic metal layers 16 and 16a may include metal silicide layers. The ohmic metal layers 16 and 16a may include, for example, tungsten layers, tungsten silicide layers, titanium layers, titanium nitride layers, cobalt layers, and nickel layers. The ohmic metal layers 16 and 16a may also include metal silicide layers, for example, tungsten silicide layers. In one embodiment, the barrier metal layer 18 may include a titanium nitride layer. Metal layer 20 may include, for example, tungsten, copper, or other pure metals, but also may include other conductive materials having low resistivity.

The resistance adjustment impurities doped in the polysilicon layer 12 may include one or more of phosphorus (P), arsenic (As), and boron (B), for example. As described above, the electrode structure 30-1 further includes the polysilicon layer 14 for adjusting the grain, in which grain adjustment impurities are precipitated among polysilicon grains. In one embodiment, the polysilicon layer 14 for adjusting the grain is doped with one or more of carbon, nitrogen, and oxygen as grain adjustment impurities as mentioned above, in addition to the resistance adjustment impurities such as phosphorus (P), arsenic (As), or boron (B). As such, the overall impurities in the polysilicon layer 14 are different from the impurities in the polysilicon layer 12, and may include the same impurities as in the polysilicon layer 12 (e.g., P, As, or B) as well as additional impurities not in the polysilicon layer 12 (e.g., C, N, or O). The polysilicon layer 14 for adjusting the grain is doped with grain adjustment impurities, and thus individual as well as average sizes of polysilicon grains in the polysilicon layer 14 may be reduced as compared to the grain sizes in polysilicon layer 12.

Therefore, as compared to the electrode structure 30p-1 of the comparative example, the electrode structure 30-1 of the present embodiment can reduce the sizes of polysilicon grains included in the polysilicon layer 14 for adjusting the grain, and precipitate the grain adjustment among polysilicon grains throughout the polysilicon layer 14. The thickness T01 of the ohmic metal layer 16 can be reduced by inhibiting a reaction between the polysilicon layer 14 for adjusting the grain and the ohmic layer 16. This results from the use of the grain adjustment impurities in the polysilicon layer 14, and results in a thinner ohmic metal layer than when a polysilicon layer without grain adjustment impurities is used. That is, the thickness T01 of the ohmic metal layer 16 can be reduced by inhibiting agglomeration of materials between the polysilicon layer 14 for adjusting the grain and the ohmic metal layer 16.

The thickness T01 of the ohmic metal layer 16 of the electrode structure 30-1 of the present embodiment may be smaller than a thickness T02 of the electrode structure 30p-1 of the comparative example. However, the electrode structure 30-1 of the present embodiment is not limited to the thickness T01 of the ohmic metal layer 16. In addition, the electrode structure 30-1 of the present embodiment can reduce the thickness of the polysilicon layer 12 and an interface resistance of the electrode structure 30-1, compared to the electrode structure 30p-1 of the comparative example.

The polysilicon grains included in the polysilicon layer 14 for adjusting the grain have small sizes, resulting in a long diffusion path, compared to the electrode structure 30p-1 of the comparative example, and the grain adjustment impurities precipitated among polysilicon grains act as obstacles of the diffusion path. Thus, the electrode structure 30-1 of the present embodiment can inhibit diffusion between metal atoms of the ohmic metal layer 16 and silicon atoms of the polysilicon material layers, and can also inhibit the resistance adjustment impurities included in the polysilicon layer 14 for adjusting the grain, in particular, boron (B), from diffusing over to the gate insulation layer 10.

Figure 3:
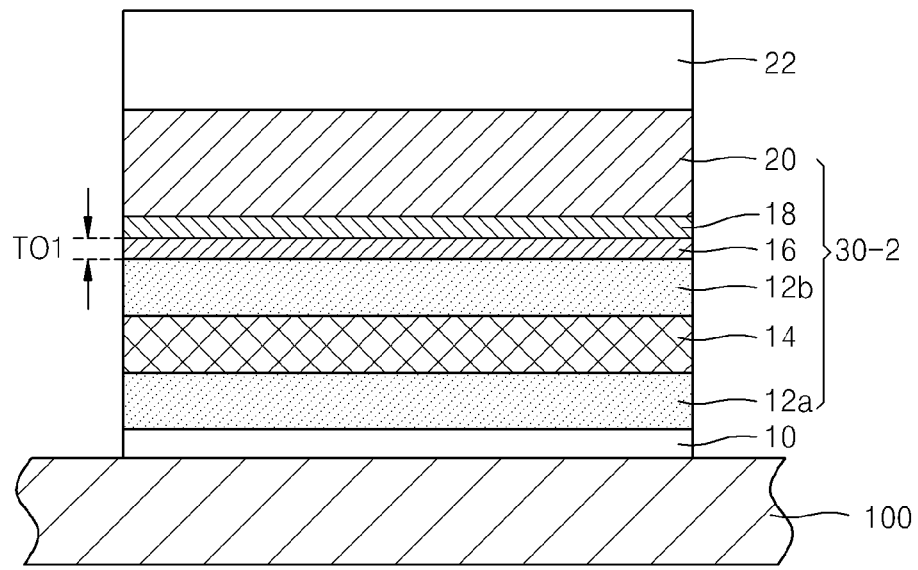
FIG. 3 is a schematic cross-sectional view for explaining an electrode structure and a method of fabricating the electrode structure, according to another exemplary embodiment.

Second Embodiment of Electrode Structure and Method of Fabricating the Electrode Structure FIG. 3 is a schematic cross-sectional view for explaining an electrode structure 30-2 and a method of fabricating the electrode structure 30-2, according to another exemplary embodiment.

Specifically, the electrode structure 30-2 of the present embodiment is the same as the electrode structure 30-1 of the previous embodiment, except that the polysilicon layer 14 for adjusting the grain is disposed between a first polysilicon layer 12a and a second polysilicon layer 12b. The electrode structure 30-2 of the present embodiment includes the first polysilicon layer 12a doped with resistance adjustment impurities, the polysilicon layer 14 for adjusting the grain and doped with grain adjustment impurities, the second polysilicon layer 12b doped with resistance adjustment impurities, the ohmic metal layer 16, the barrier metal layer 18, and the metal layer 20 that are sequentially formed on the gate insulation layer 10. In one embodiment, both first and second polysilicon layers 12a and 12b include the same resistance adjustment impurities, and polysilicon layer 14 includes the resistance adjustment impurities as well as additional grain adjustment impurities.

The polysilicon layer 14 for adjusting the grain included in the electrode structure 30-2 of the present embodiment may be formed in a specific level of the first polysilicon layer 12a and the second polysilicon layer 12b. In particular, in one embodiment, the polysilicon layer 14 for adjusting the grain is formed by depositing a precursor including grain adjustment impurities or through an epitaxial growth process so that the polysilicon layer 14 for adjusting the grain is uniformly formed between the first polysilicon layer 12a and the second polysilicon layer 12b. The uniformly forming of the polysilicon layer 14 for adjusting the grain can improve the effect of the present embodiments.

When the polysilicon layer 14 for adjusting the grain is disposed between the first polysilicon layer 12a and the second polysilicon layer 12b, polysilicon grains included in the polysilicon layer 14 for adjusting the grain have smaller sizes and higher concentration, compared to the electrode structure 30p-1 of the comparative example, resulting in a long diffusion path, and grain adjustment impurities precipitated among polysilicon grains act as obstacles of the diffusion path. Thus, the electrode structure 30-2 of the present embodiment can inhibit diffusion between metal atoms of the ohmic metal layer 16 and silicon atoms of the polysilicon material layers, and can also inhibit the resistance adjustment impurities included in the polysilicon layer 14 for adjusting the grain and the second polysilicon layer 12b, in particular, boron (B), from diffusing over to the gate insulation layer 10.

Figure 4:
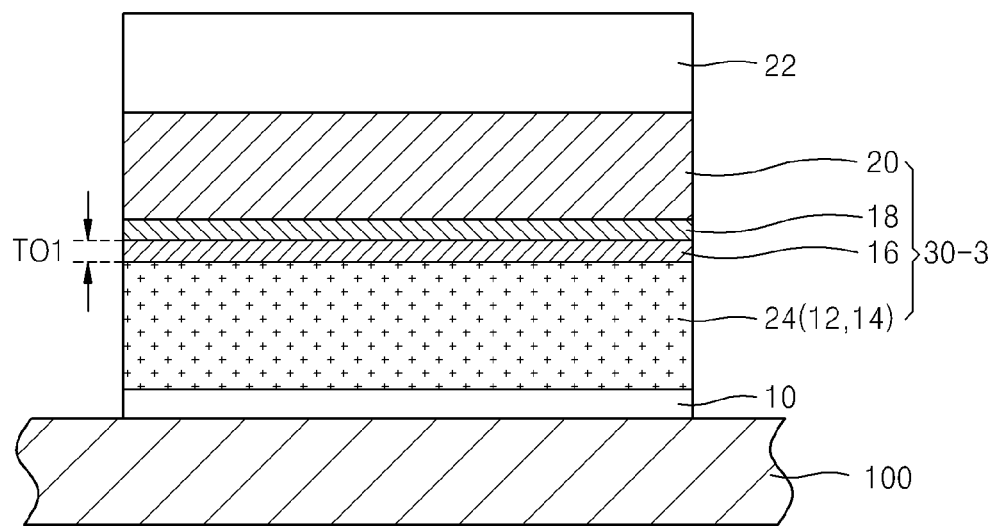
FIG. 4 is a schematic cross-sectional view for explaining an electrode structure and a method of fabricating the electrode structure, according to another exemplary embodiment.

Third Embodiment of Electrode Structure and Method of Fabricating the Electrode Structure FIG. 4 is a schematic cross-sectional view for explaining an electrode structure 30-3 and a method of fabricating the electrode structure 30-3, according to another exemplary embodiment.

Specifically, the electrode structure 30-3 of the present embodiment is the same as the electrode structure 30-1 of the previous embodiment, except that the polysilicon layer 14 for adjusting the grain is formed in the entire polysilicon layer 12. That is, the electrode structure 30-3 of the present embodiment is the same as the electrode structure 30-1 of the previous embodiment, except that a single polysilicon layer 24 including the polysilicon layer 14 for adjusting the grain and doped with grain adjustment impurities and the polysilicon layer 12 doped with resistance adjustment impurities is formed.

The electrode structure 30-3 of the present embodiment includes the single polysilicon layer 24 including the polysilicon layer 14 for adjusting the grain and doped with grain adjustment impurities and the polysilicon layer 12 doped with resistance adjustment impurities, the ohmic metal layer 16, the barrier metal layer 18, and the metal layer 20 that are sequentially formed on the gate insulation layer 10. In this case, as compared to the electrode structure 30p-1 of the comparative example, the thickness of the ohmic layer 16 of the electrode structure 30-3 of the present embodiment is reduced, thereby reducing the thickness of the single polysilicon layer 24, and inhibiting the resistance adjustment impurities, in particular, boron (B), from diffusing over to the gate insulation layer 10.

Next, a semiconductor device using the electrode structures 30-1, 30-2, and 30-3 of the above embodiments, for example, a complementary metal-oxide-semiconductor (CMOS) device, will now be described. In addition, a method of fabricating the electrode structures 30-1, 30-2, and 30-3 and a method of fabricating the semiconductor device will now be described. The electrode structures 30-1, 30-2, and 30-3 are labeled as an electrode structure 30 for descriptive convenience.

FIGS. 5 through 8 are schematic cross-sectional views for explaining a semiconductor device using an electrode structure and a method of fabricating the semiconductor device, according to exemplary embodiments.

Figure 5:
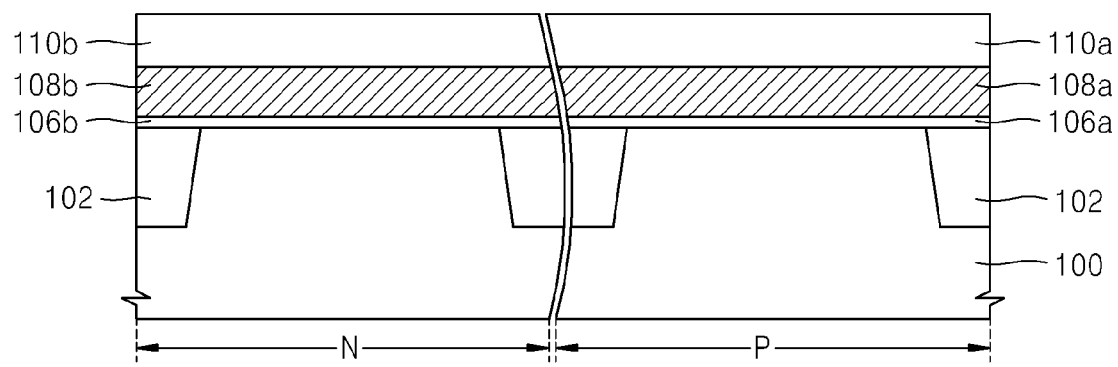
FIGS. 5 through 8 are schematic cross-sectional views for explaining a semiconductor device using an electrode structure and a method of fabricating the semiconductor device, according to an exemplary embodiment.

Referring to FIG. 5, a device isolation layer 102 is formed on a semiconductor substrate 100 including an n-type metal-oxide-semiconductor (NMOS) region N and a p-type metal-oxide-semiconductor (PMOS) region P. The device isolation layer 102 may be formed through, for example, a shallow trench isolation (STI) process. An NMOS active region and a PMOS active region are defined by the NMOS region N and the PMOS region P, respectively, by the device isolation layer 102. A P-well and an N-well may be formed in the NMOS active region and the PMOS active region, respectively, through a process of forming a CMOS well.

Gate insulation material layers 106a and 106b are formed on the entire surface of the semiconductor device 100 including the device isolation layer 102. The gate insulation material layers 106a and 106b may include, for example, silicon oxide layers, silicon oxynitride layers or high dielectric layers. High dielectric layers may include, for example, aluminium oxide layers, hafnium oxide layers, zirconium oxide layers, lantanium oxide layers, hafnium silicate layers, hafnium aluminium oxide layers, titanium oxide layers, or tantalum oxide layers, or deposition layers including combinations thereof. The gate insulation material layers 106a and 106b may be deposited, for example, through chemical vapor deposition (CVD) or atomic layer deposition (ALD) or may be grown through a thermal oxidation.

Polysilicon material layers 108a and 108b doped with resistance adjustment impurities, for example, phosphorus (P), arsenic (As), or boron (B), are formed on the gate insulation material layers 106a and 106b. In one embodiment, the polysilicon material layer 108a doped with boron (B) is formed in the PMOS region P. In addition, the polysilicon material layer 108b doped with phosphorus (P) or arsenic (As) is formed in the NMOS region N. Polysilicon material layers 110a and 110b for adjusting grains and doped with grain adjustment impurities are formed on the polysilicon material layers 108a and 108b doped with resistance adjustment impurities.

The polysilicon material layers 110a and 110b for adjusting the grain are doped with any one of carbon, nitrogen, and oxygen as grain adjustment impurities, in addition to phosphorus (P), arsenic (As), or boron (B) as resistance adjustment impurities.

The polysilicon material layers 110a and 110b for adjusting the grain may be formed on the polysilicon material layers 108a and 108b doped with resistance adjustment impurities by in-situ depositing a precursor including grain adjustment impurities, for example, any one of carbon, nitrogen, and oxygen. The polysilicon material layers 110a and 110b for adjusting the grain may be formed by doping any one of carbon, nitrogen, and oxygen through an epitaxial growth process.

The polysilicon material layers 110a and 110b for adjusting the grain are doped with grain adjustment impurities as mentioned above, and thus sizes of polysilicon grains may be reduced.

Figure 6:
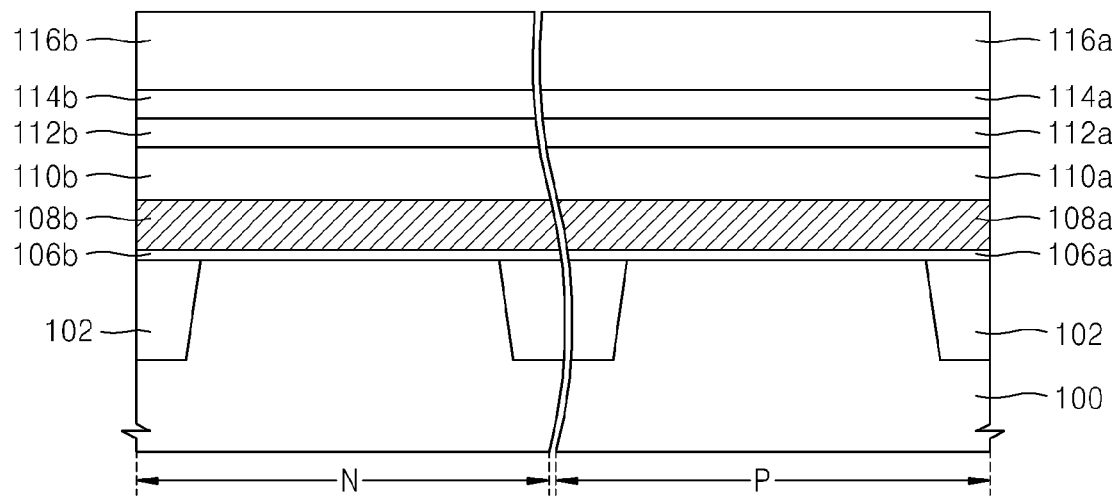

Referring to FIG. 6, ohmic metal layers 112a and 112b, barrier metal layers 114a and 114b, and metal layers 116a and 116b are formed on the polysilicon material layers 110a and 110b for adjusting the grain. The ohmic metal layers 112a and 112b may include, for example, tungsten layers, tungsten silicide layers, titanium layers, titanium nitride layers, cobalt layers, and nickel layers. The barrier metal layers 114a and 114b may include, for example, titanium nitride layers. The metal layers 116a and 116b may include, for example, tungsten or copper layers.

A difference in the thickness between the ohmic metal layer 112b of the NMOS region N and the ohmic metal layer 112a of the PMOS region P may be reduced by using the polysilicon material layers 110a and 110b for adjusting the grain, compared to a situation where the a grain adjusting layer is not used. That is, if a subsequent thermal process is performed after the ohmic metal layers 112a and 112b are formed, the grain adjustment impurities, for example, any one of carbon, nitrogen, and oxygen, inhibit diffusion between metal atoms of the ohmic metal layers 112a and 112b and silicon atoms of the polysilicon material layers 110a and 110b for adjusting the grain or the polysilicon material layers 108a and 108b, thereby reducing the difference in the thickness between the ohmic metal layer 112a and the ohmic metal layer 112b.

Further, if a subsequent thermal process is performed after the ohmic metal layers 112a and 112b are formed, the grain adjustment impurities inhibit agglomeration between the polysilicon material layers 110a and 110b for adjusting the grain and the ohmic metal layers 112a and 112b and prevent an increase in the interface resistance of the electrode structure.

Further, the grain adjustment impurities included in the polysilicon material layers 110a and 110b for adjusting the grain of the present embodiment can reduce sizes of polysilicon grains. Thus, when a subsequent thermal process is performed after the ohmic metal layers 112a and 112b are formed, the interface characteristics of the gate insulation material layers 106a and 106b can be improved by inhibiting diffusion of the resistance adjustment impurities included in the polysilicon material layers 110a and 110b for adjusting the grain, in particular, boron (B).

Figure 7:
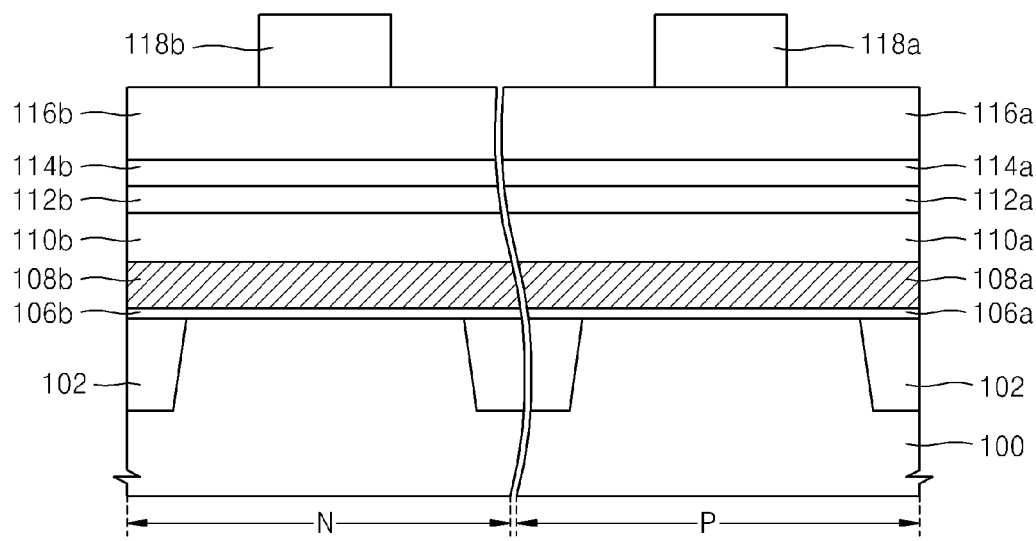

Referring to FIG. 7, mask layers 118a and 118b are formed on the metal layers 116a and 116b of the PMOS region P and the NMOS region N, respectively. The mask layers 118a and 118b may include, for example, silicon nitride layers. The mask layers 118a and 118b may be used as gate cap layers.

Figure 8:
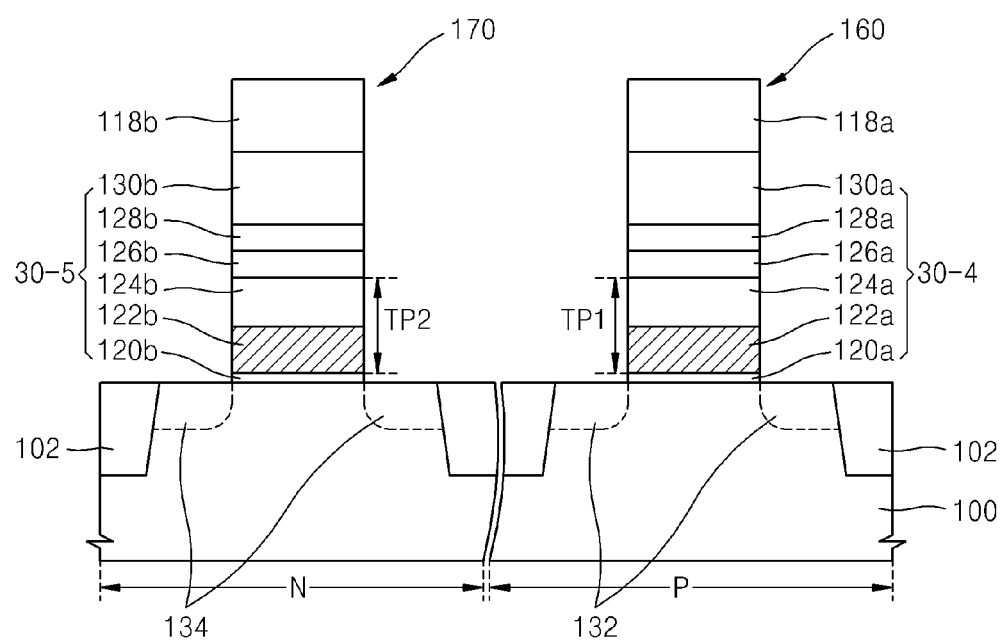

Referring to FIG. 8, the metal layers 116a and 116b, the barrier metal layers 114a and 114b, the ohmic metal layers 112a and 112b, the polysilicon layers 110a and 110b for adjusting the grain, the polysilicon layers 108a and 108b, and the gate insulation layers 106a and 106b are sequentially etched by using the mask layers 118a and 118b as etching masks. In one embodiment, a plasma dry etching process may be used.

As a result, a first gate stack 160 including a first gate insulation layer 120a, a first electrode structure 30-4, and a first gate cap layer 118a is formed on the PMOS region P. The first electrode structure 30-4 includes a metal layer 130a, a barrier metal layer 128a, an ohmic metal layer 126a, a polysilicon layer for adjusting grains 124a, and a polysilicon layer 122a. A second gate stack 170 including a second gate insulation layer 120b, a second electrode structure 30-5, and a second gate cap layer 118b is formed on the NMOS region N. The second electrode structure 30-5 includes a metal layer 130b, a barrier metal layer 128b, an ohmic metal layer 126b, a polysilicon layer for adjusting grains 124b, and a polysilicon layer 122b. A surface of the semiconductor substrate 100 is exposed between the first and second gate stacks 160 and 170.

During the etching process, the thickness TP1 of the polysilicon layer 122a and the polysilicon layer for adjusting the grain 124a included in the first electrode structure 30-4 and the thickness TP2 of the polysilicon layer 122b and the polysilicon layer for adjusting grains 124b included in the second electrode structure 30-5 do not differ from each other, and the thicknesses of the polysilicon layer 122a and 122b and the polysilicon layers for adjusting the grain 124a and 124b may be reduced.

Next, a P type impurity region 132 is formed by injecting P type impurities, for example, boron (B), into both sides of the first gate stack 160 of the PMOS region P. The P type impurity region 132 is a P type source/drain region. An N type impurity region 134 is formed by injecting N type impurities, for example, phosphorus (P) or arsenic (As), into both sides of the second gate stack 170 of the NMOS region N. The N type impurity region 134 is an N type source/drain region.

Figure 9:
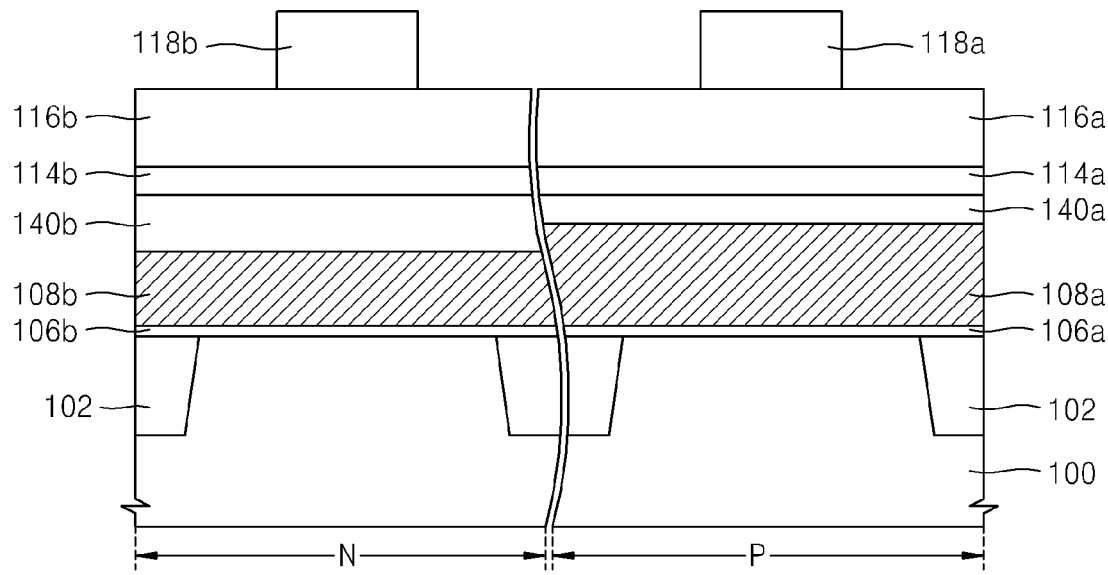
FIGS. 9 and 10 are schematic cross-sectional views for explaining a semiconductor device using an electrode structure and a method of fabricating the semiconductor device, as a comparative example related to FIGS. 5 through 8.
Figure 10:
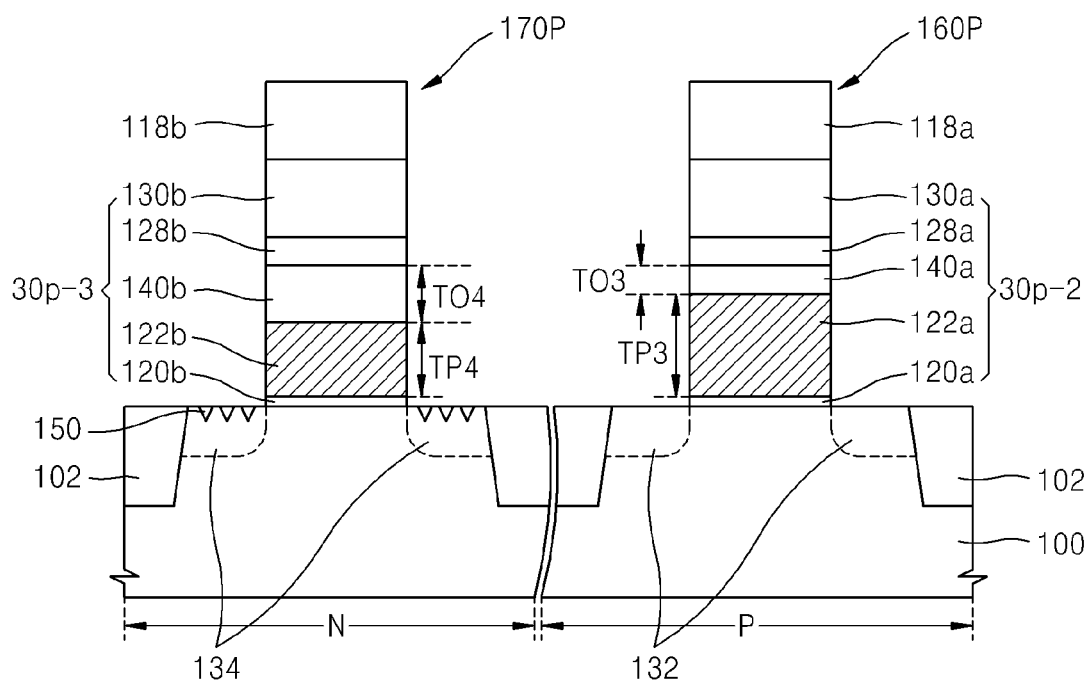

FIGS. 9 and 10 are schematic cross-sectional views for explaining a semiconductor device using an electrode structure and a method of fabricating the semiconductor device as a comparative example related to FIGS. 5 through 8.

Specifically, the semiconductor device of the comparative example is the same as the semiconductor device described with reference to FIGS. 5 through 8, except that a polysilicon layer for adjusting grains is not formed. FIG. 9 corresponds to FIGS. 6 and 7. The device isolation layer 102 is formed in the semiconductor substrate 100 including the NMOS region N and the PMOS region P. The gate insulation material layers 106a and 106b and the polysilicon material layers 108a and 108b doped with resistance adjustment impurities, for example, phosphorus (P), arsenic (As), or boron (B), are formed on the semiconductor layer 100.

Thereafter, ohmic metal layers 140a and 140b, the barrier metal layers 114a and 114b, and the metal layers 116a and 116b are formed on the polysilicon layers 108a and 108b. The ohmic metal layers 140a and 140b may include, for example, tungsten layers, tungsten silicide layers, titanium layers, titanium nitride layers, cobalt layers, and nickel layers. The materials of the barrier metal layers 114a and 114b and the metal layers 116a and 116b may be the same as described above.

If a subsequent thermal process is performed after the ohmic metal layers 140a and 140b are formed, a reaction between the ohmic metal layer 140b of the NMOS region N and the polysilicon material layer 108b is different from that between the ohmic metal layer 140a of the PMOS region P and the polysilicon material layer 108a. Thus, the thickness of the ohmic metal layer 140b of the NMOS region N may be greater than that of the ohmic metal layer 140a of the PMOS region P.

In other words, the thicknesses of the ohmic metal layer 140b of the NMOS region N and the ohmic metal layer 140a of the PMOS region P differ from each other. Such a difference in the thickness makes it difficult to reliably perform a subsequent stack process in the comparative example, unlike the disclosed embodiments, which help evenly reduce the depth of a gate stack throughout a semiconductor device.

Further, if a subsequent thermal process is performed after the ohmic metal layers 140a and 140b are formed, significant agglomeration between the ohmic metal layers 140a and 140b and the polysilicon material layers 108a and 108b occurs, which increases the interface resistance of the electrode structure.

If a subsequent thermal process is performed after the ohmic metal layers 140a and 140b are formed, resistance adjustment impurities included in the polysilicon layers 108a and 108b, in particular, boron (B), diffuse relatively easily over to a gate insulation layer, which deteriorates the interface characteristics of the gate insulation layer. In the same manner as described above in connection with FIG. 8, the mask layers 118a and 118b are formed on the metal layers 116a and 116b of the PMOS region P and the NMOS region N, respectively.

Referring to FIG. 10, the metal layers 116a and 116b, the barrier metal layers 114a and 114b, the ohmic metal layers 140a and 140b, the polysilicon layers 108a and 108b, and the gate insulation layers 106a and 106b are sequentially etched by using the mask layers 118a and 118b as etching masks.

A first gate stack 160p including the first gate insulation layer 120a, a first comparative electrode structure 30p-2, and the first gate cap layer 118a is formed on the PMOS region P. The first comparative electrode structure 30p-2 includes the metal layer 130a, the barrier metal layer 128a, the ohmic metal layer 142a, and the polysilicon layer 122a. A second gate stack 170p including the second gate insulation layer 120b, a second comparative electrode structure 30p-3, and the second gate cap layer 118b is formed on the NMOS region N. The second comparative electrode structure 30p-3 includes the metal layer 130b, the barrier metal layer 128b, the ohmic metal layer 142b, and the polysilicon layer 122b. A surface of the semiconductor substrate 100 is exposed between the first and second gate stacks 160p and 170p.

In the comparative example, the thickness T03 of the ohmic metal layer 142a included in the first comparative electrode structure 30p-2 and the thickness T04 of the ohmic metal layer 142b included in the second comparative electrode structure 30p-3 differ from each other, and thus the thickness TP3 of the polysilicon layer 122a included in the first comparative electrode structure 30p-2 and the thickness TP4 of the polysilicon layer 122b included in the second comparative electrode structure 30p-3 also differ from each other.

In the comparative example, when the first and second comparative electrode structures 30p-2 and 30p-3 are formed during an etching process, a difference in the thickness between the polysilicon layers 122a and 122b causes pitting 150 which is indentations in the semiconductor substrate 100 of the NMOS region N. Thus, unlike the disclosed embodiments, it is difficult to reliably perform a subsequent stack process in the comparative example.

Next, the P type impurity region 132 is formed in both sides of the first comparative gate stack 160p of the PMOS region P. The N type impurity region 134 is formed in both sides of the second comparative gate stack 170p of the NMOS region N.

Figure 11:
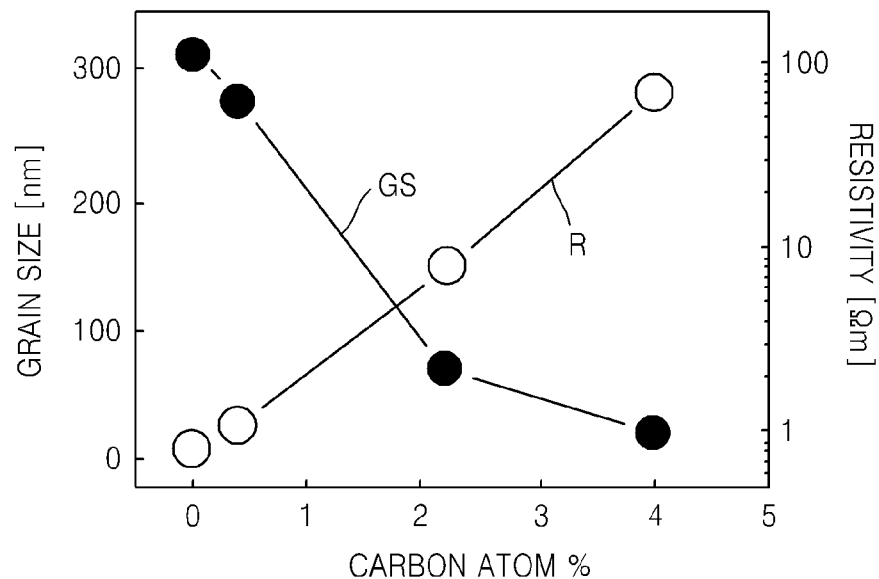
FIG. 11 is a graph of variations in polysilicon grain size and polysilicon resistivity with respect to concentrations of grain adjustment impurities doped in a polysilicon layer for adjusting grains, according to an exemplary embodiment.

FIG. 11 is a graph of variations of polysilicon grain size GS and polysilicon resistivity R with respect to concentrations of grain adjustment impurities doped in a polysilicon layer for adjusting the grain, according to an exemplary embodiment.

Specifically, as described above, an electrode structure as disclosed herein includes the polysilicon layer for adjusting the grain doped with the grain adjustment impurities. Referring to the example shown in FIG. 11, the grain adjustment impurities use carbon. The higher the concentration (%) of a carbon atom, the smaller the size GS of the polysilicon grain, and the greater the resistivity R. As shown in FIG. 11, in one embodiment, as a result of the grain adjustment impurities reaching a certain percentage, an average grain size of grains in the polysilicon layer for adjusting grains may be less than a certain percentage (e.g., 33%, or 20%) of the average grain size of grains in the polysilicon layer with resistance adjustment impurities (e.g., compare the grain size at 0% impurity concentration with the grain size at 2% impurity concentration or at 4% impurity concentration, as shown in FIG. 11).

The grain adjustment impurities are dopants which reduce the size GS of the polysilicon grain, thereby obtaining various effects as described above. For example, a reduction in the size GS of the polysilicon grain inhibits agglomeration between the polysilicon layer and an ohmic metal layer, thereby reducing the interface resistance of the electrode structure and a difference in the thickness between the ohmic layers of an NMOS region and a PMOS region. Furthermore, resistance adjustment impurities included in the polysilicon layer for adjusting the grain, in particular, boron (B), are inhibited from diffusing over to a gate insulation layer, thereby improving the interface characteristics of the gate insulation layer.

Figure 12:
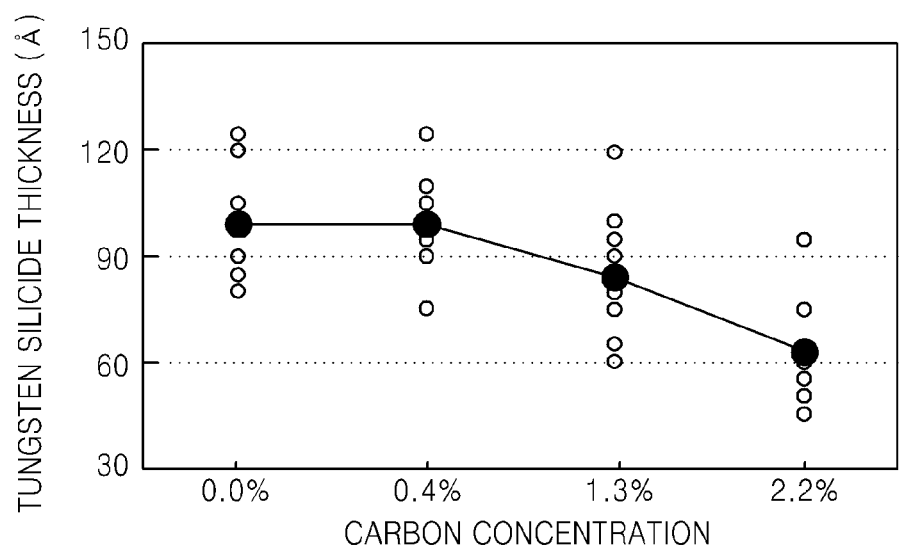
FIG. 12 is a graph of variations in the thickness of a ohmic metal layer with respect to concentrations of grain adjustment impurities doped in a polysilicon layer for adjusting grains, according to an exemplary embodiment.

FIG. 12 is a graph of variations of the thickness of a ohmic metal layer with respect to concentrations of grain adjustment impurities doped in a polysilicon layer for adjusting the grain, according to an exemplary embodiment.

Specifically, as described above, an electrode structure includes the polysilicon layer for adjusting the grain doped with the grain adjustment impurities. Referring to the example of FIG. 12, the grain adjustment impurities use carbon, and an ohmic metal layer uses a tungsten silicide layer. The higher the concentration (%) of a carbon atom, the smaller the thickness of the tungsten silicide layer that is the ohmic metal layer. For example, in one embodiment, as a result of the grain adjustment impurities, a thickness of the ohmic metal layer can be reduced by more than 25% compared to if the grain adjustment impurities had not been included the polysilicon layer (e.g., compare the thickness at 0.0% impurity concentration to the thickness at 2.2% impurity concentration).

As described above, the grain adjustment impurities are dopants which reduce the size of the polysilicon grain, thereby inhibiting agglomeration between the polysilicon layer and the ohmic metal layer. A reduction in the thickness of the ohmic metal layer may reduce the interface resistance of the electrode structure.

Figure 13:
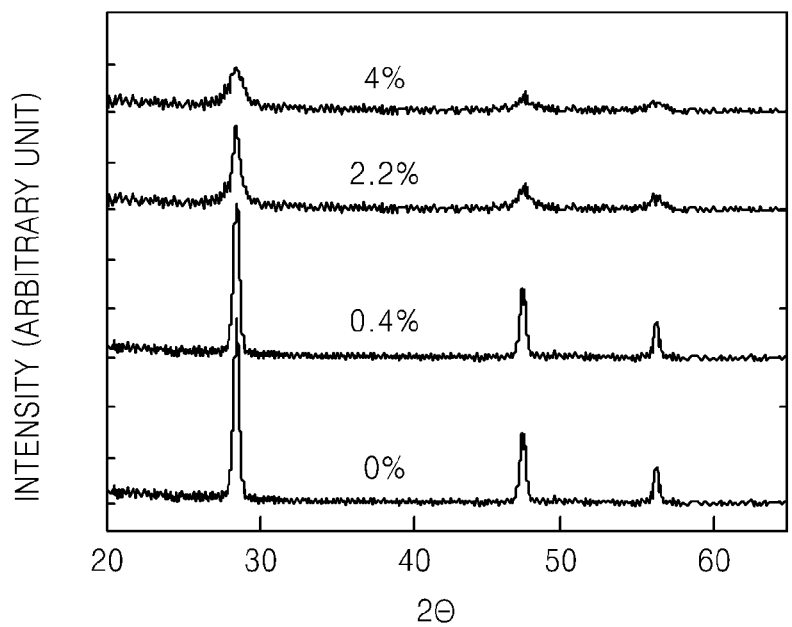
FIG. 13 is a graph of an X-ray graph of a polysilicon layer for adjusting grains with respect to concentrations of grain adjustment impurities, according to an exemplary embodiment.

FIG. 13 is a graph of an X-ray graph of a polysilicon layer for adjusting grains with respect to concentrations of grain adjustment impurities, according to an exemplary embodiment.

Specifically, an electrode structure as disclosed herein includes the polysilicon layer for adjusting the grain, which is doped with grain adjustment impurities. Referring to the example of FIG. 13, the grain adjustment impurities use carbon. The higher the concentration (%) of a carbon atom (e.g., compare 0.4%, 2.2%, and 4%), the smaller the size of the polysilicon grain, and the lower the peak intensity of diffraction for the different diffraction angles of polysilicon grain. The grain adjustment impurities are dopants that reduce the size of the polysilicon grain, thereby obtaining various beneficial effects of the as described above.

Figure 14:
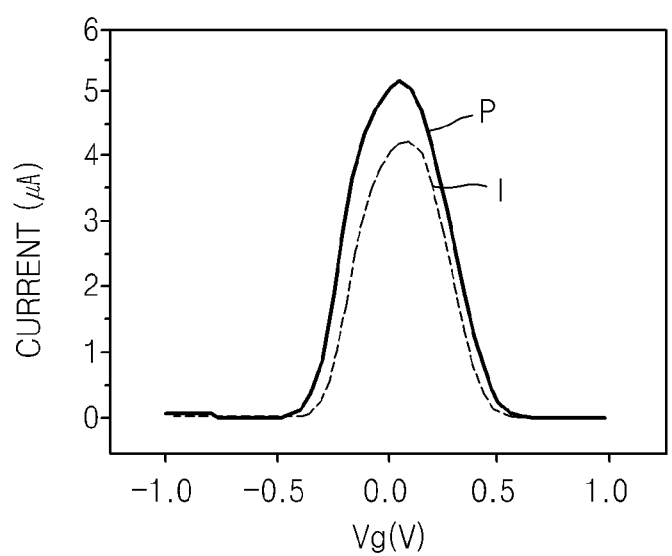
FIG. 14 is a graph of variations of a leakage current with respect to a gate voltage of a PMOS device, according to an exemplary embodiment.

FIG. 14 is a graph of variations of a leakage current with respect to a gate voltage Vg of a PMOS device, according to an exemplary embodiment.

Specifically, the graph shows variations of the leakage current with respect to the gate voltage Vg of the PMOS device including an electrode structure of the disclosed embodiments. The PMOS device is formed in the PMOS region P of FIG. 8. The electrode structure includes a polysilicon layer for adjusting grains doped with grain adjustment impurities.

Referring to the example of FIG. 14, the grain adjustment impurities use carbon. The leakage current of the disclosed embodiments is low compared to the PMOS device P of the comparative example that does not include the polysilicon layer for adjusting the grain doped with grain adjustment impurities. That results in part from the polysilicon layer for adjusting the grain inhibiting boron (B) or other dopants of the polysilicon layer from diffusing.

Figure 15:
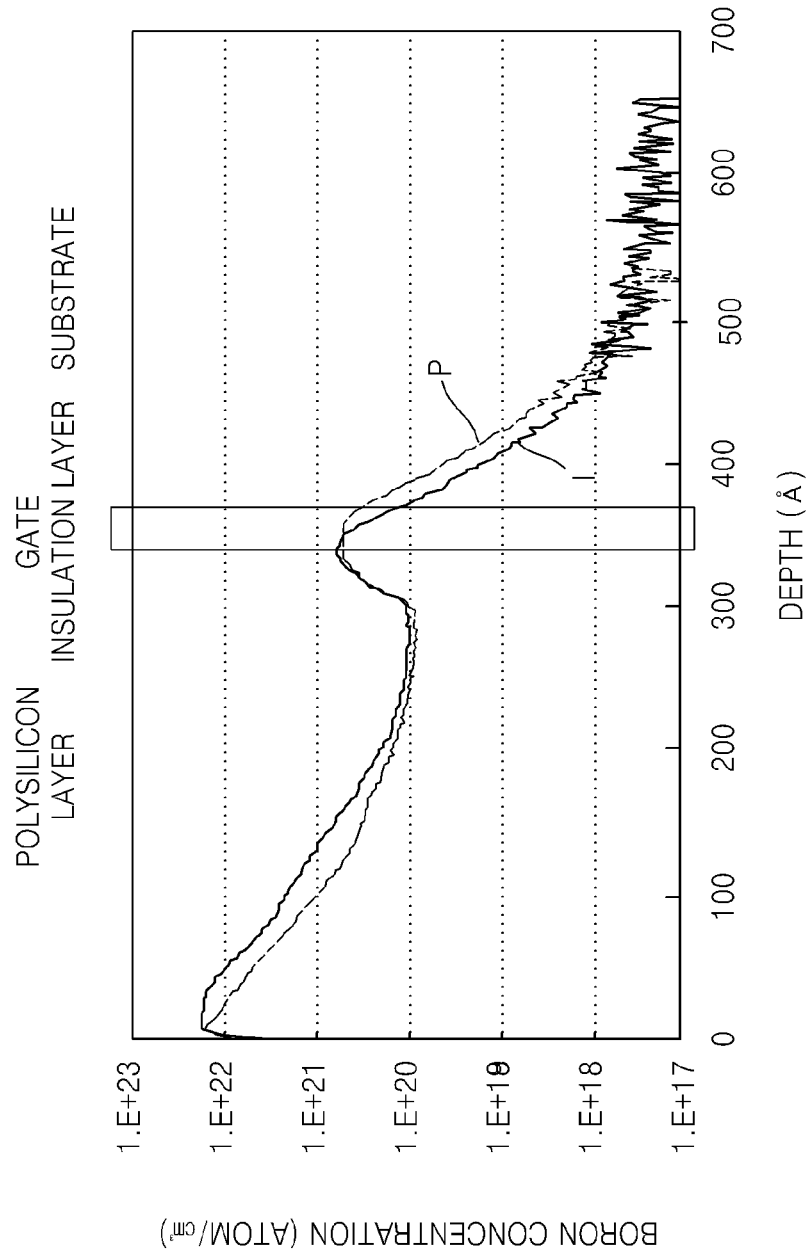
FIG. 15 is a secondary ion mass spectrometry (SIMS) graph of diffusion of boron (B) that is impurities doped in a polysilicon layer, according to an exemplary embodiment.

FIG. 15 is a secondary ion mass spectrometry (SIMS) graph of diffusion of boron (B) that is impurities doped in a polysilicon layer, according to an exemplary embodiment.

Specifically, reference character I indicates a measurement of the diffusion of boron (B) of a sample of the disclosed embodiments in which the polysilicon layer doped with carbon as the grain adjustment impurities is formed after a gate oxide layer is formed on a semiconductor substrate as a gate insulation layer. Reference character P indicates a measurement of the diffusion of boron (B) in a sample of a comparative example in which a polysilicon layer not doped with carbon is formed after a gate oxide layer is formed on a semiconductor substrate as a gate insulation layer.

Referring to FIG. 15, in the sample of the embodiment in which a polysilicon layer, the gate oxide layer, and the polysilicon layer doped with carbon on a semiconductor substrate are formed, boron (B) has a low concentration. This means that the diffusion of boron (B) is inhibited when the polysilicon layer is doped with carbon.

An integrated circuit semiconductor device, for example, a dynamic random access memory (DRAM) device, using the electrode structure 30 of the disclosed embodiments will now be described. However, the electrode structure 30 can be used in other memory devices (e.g., PRAM, SRAM, flash memory, etc.) or non-memory devices as well.

Figure 16:
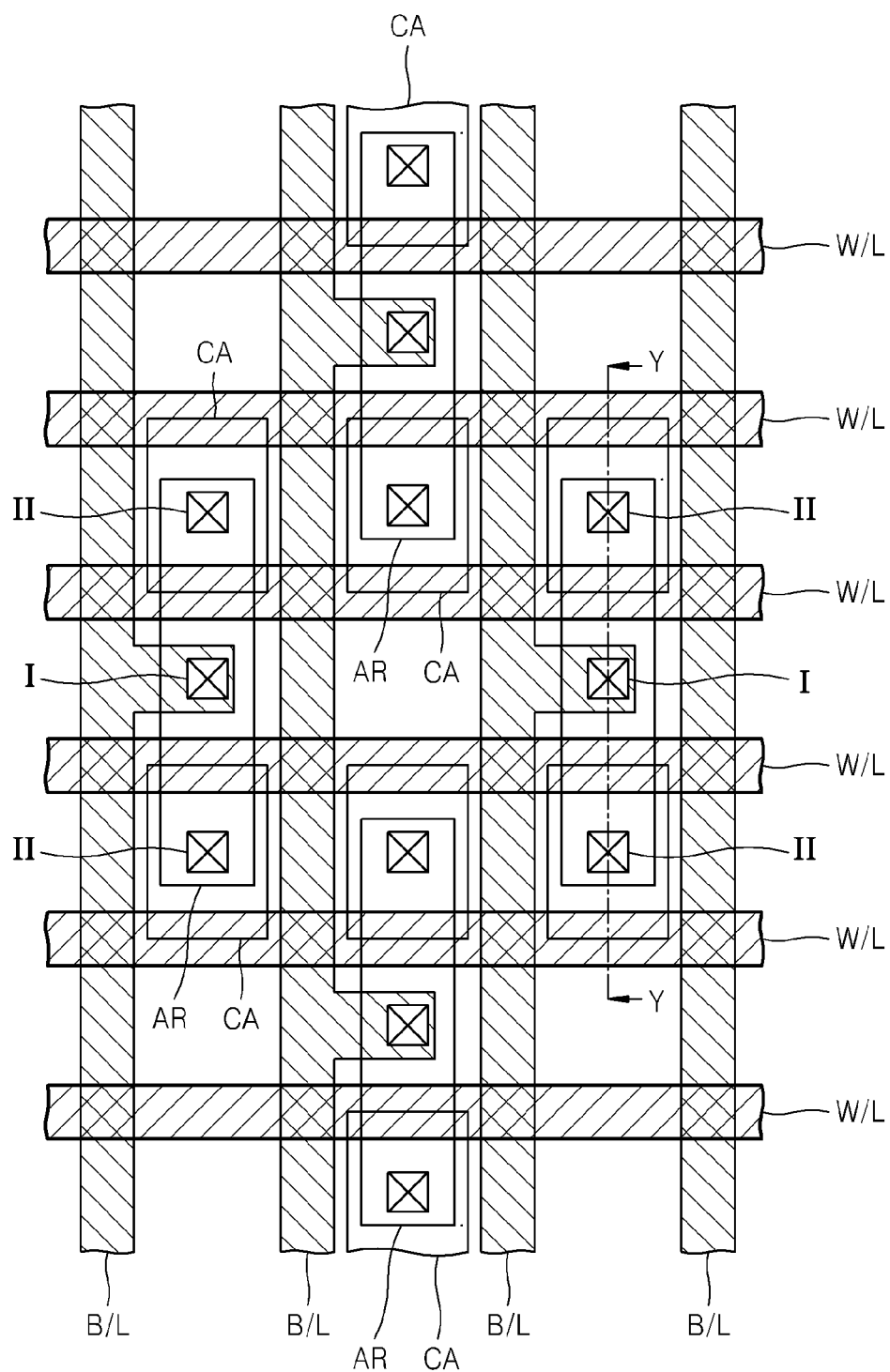
FIG. 16 is a layout of a dynamic random access memory (DRAM) device using an electrode structure, according to an exemplary embodiment.

FIG. 16 is a layout of a DRAM device using an electrode structure, according to an exemplary embodiment. However, the disclosed embodiments are not limited to this exemplary layout of the DRAM device.

Active regions AR are defined by non-active regions (field regions (FR)). Two word lines W/L cross each of the active regions AR. Bit lines B/L are disposed in different layers to those of the word lines W/L and are perpendicular to the word lines W/L. The word lines W/L are disposed in a direction, and the bit lines B/L are disposed perpendicular to the word lines W/L.

Direct contact (DC) pad electrodes I connected to the bit lines B/L are formed on drain regions disposed in the active regions AR. Buried contact (BC) pad electrodes II connected to lower electrodes are formed on source regions disposed in the active regions AR. Capacitors CA of the DRAM device, i.e. the lower electrodes, are formed on the BC pad electrodes II.

Figure 17:
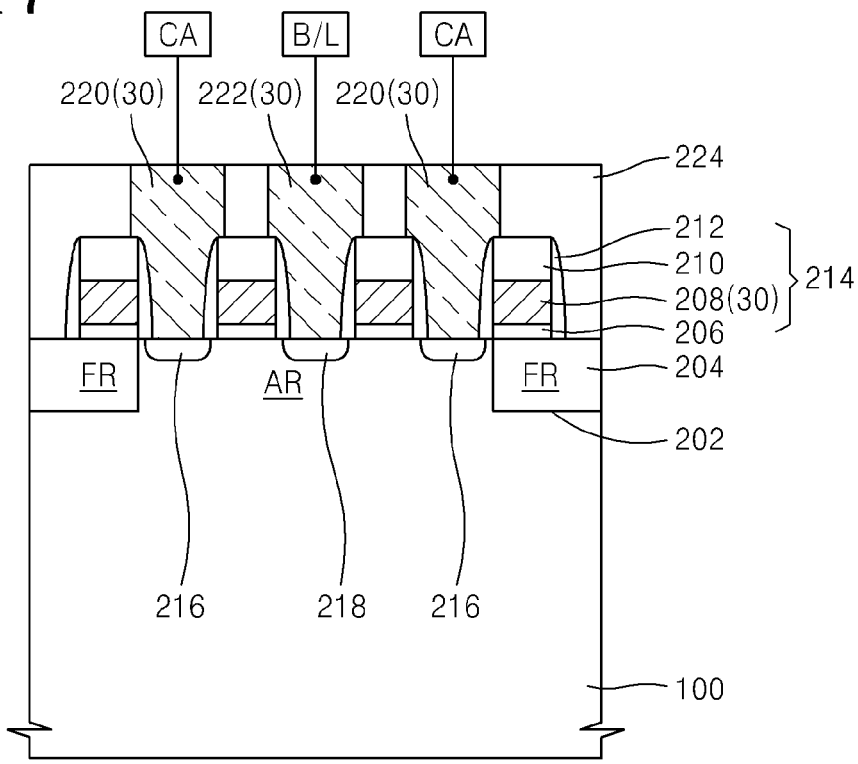
FIGS. 17 and 18 are cross-sectional views of DRAM devices taken along a line Y-Y of FIG. 16, according to exemplary embodiments.
Figure 18:
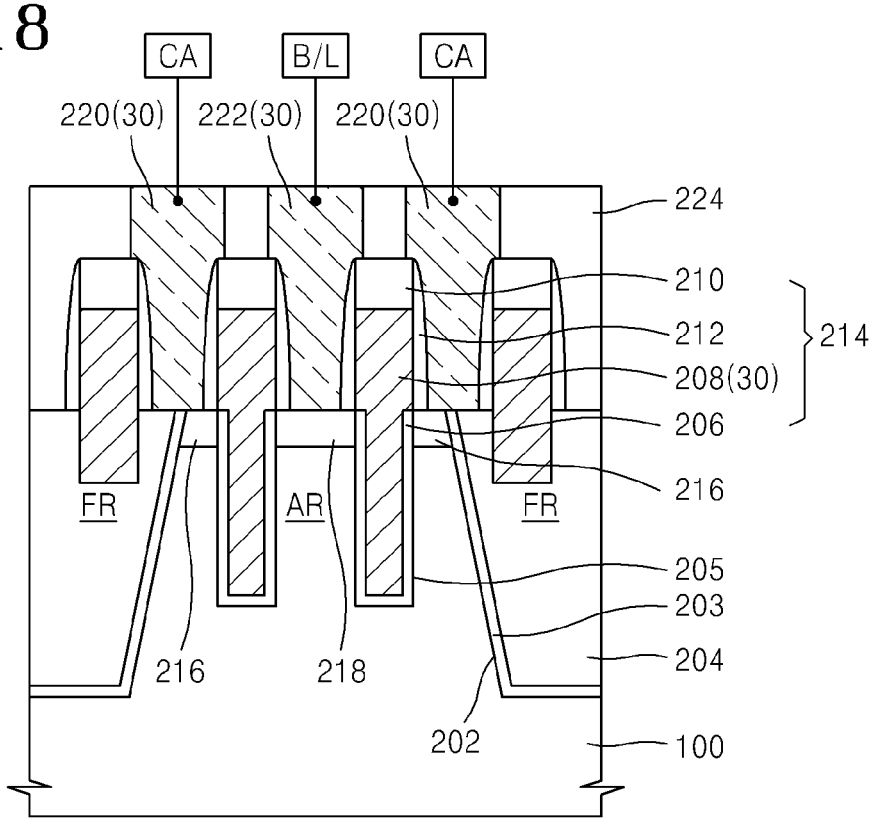

FIGS. 17 and 18 are exemplary cross-sectional views of DRAM devices, taken along a line Y-Y of FIG. 16.

Referring to FIG. 17, in one embodiment, the DRAM device includes a planar channel array transistor. Referring to FIG. 18, in one embodiment, the DRAM device includes a recess channel array transistor.

The active region AR defined by the non-active regions FR is formed on the semiconductor substrate 100, for example, a silicon substrate. The non-active regions FR are formed by burying an insulation layer in trenches 202 formed by etching the semiconductor substrate 100. Liner layers 203, for example, nitride layers, may be formed in the trenches 202.

A plurality of gate stacks 214 that act as the word lines W/L are formed on the semiconductor substrate 100 in which the active region AR is defined. Each gate stack 214 includes a gate insulation layer 206, a gate electrode 208, which may include the electrode structure 30, a gate cap layer 210, and a gate spacer 212. In FIG. 18, the recess type gate stack 214 includes the gate insulation layer 206 formed in the inner wall of a recess channel trench 205, a gate electrode 208 burying the recess channel trench 205 and including the electrode structure 30, and the gate cap layer 210 and the gate spacer 212 formed on the gate electrode 208.

The gate stacks 214 may include the electrode structure 30 as described above. The construction and function of the electrode structure 30 are described above and thus a detailed description thereof will not be repeated here. In one embodiment, the gate cap layer 210 includes a silicon nitride layer having a good selection ratio with a silicon oxide layer used as an interlayer insulation layer. The gate spacer 212 may include a silicon nitride layer having a good selection ratio with a silicon oxide layer used as an interlayer insulation layer.

Impurity regions 216 and 218, i.e. the source region 216 and the drain region 218, are formed in the lower portions of both walls of the gate stacks 214. The impurity regions 216 and 218 are formed on the semiconductor substrate 100 between the gate stacks 214.

In one embodiment, contact pad electrodes 220 and 222, which may include the electrode structure 30, are formed on the semiconductor substrate 100 between the gate spacers 212. The construction and function of these electrode structures 30 are described above and thus a detailed description thereof will not be repeated here. When the contact pad electrodes 220 and 222 include the electrode structure 30, impurities included in the electrode structure 30 are prevented from diffusing over to the impurity regions 216 and 218, i.e. the source region 216 and the drain region 218, thereby improving the electrical characteristics of the electrode structure 30, and no void or seam is formed in the contact pad electrodes 220 and 222, thereby improving the contact characteristics of the electrode structure 30.

The contact pad electrodes 220 and 222 are formed between the gate stacks 214 on the impurity regions 216 and 218. In one embodiment, the contact pad electrodes 220 and 222 are insulated by an interlayer insulation layer 224. The interlayer insulation layer 224 includes, for example, a silicon oxide layer. The contact pad electrodes 220 and 222 respectively include the DC pad electrode 222 and the BC pad electrode 220 as described above. The bit line B/L and the capacitors CA are connected to the DC pad electrode 222 and the BC pad electrode 220, respectively.

Figure 19:
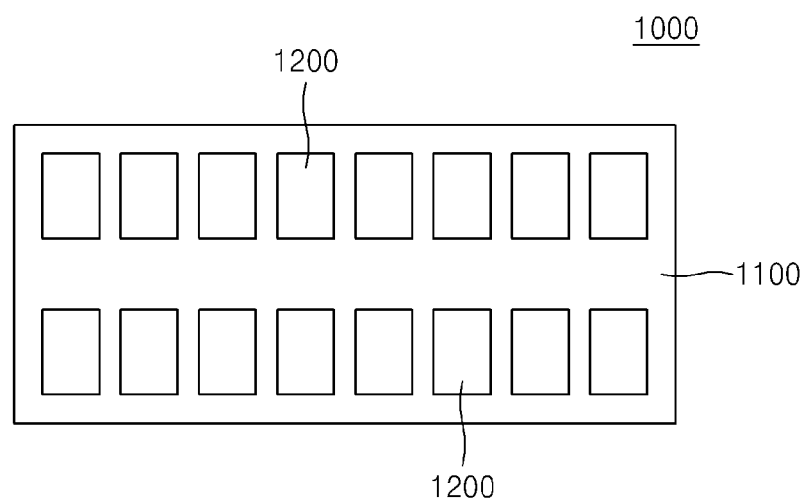
FIG. 19 is a plan view of a memory module including a semiconductor device including an electrode structure, according to an exemplary embodiment.

FIG. 19 is a plan view of a memory module 1000 including a semiconductor device including an electrode structure, according to an exemplary embodiment.

In one embodiment, the memory module 1000 may include a printed circuit board (PCB) 1100 and a plurality of semiconductor packages 1200. The semiconductor packages 1200 may include the semiconductor device including the electrode structure according to the disclosed embodiments. The semiconductor packages 1200 may include, for example, a plurality of stacked semiconductor devices, or a single semiconductor device, or may include a package-on-package device. The memory module 1000 may be a single in-line memory module (SIMM) in which the semiconductor packages 1200 are mounted on one surface of the PCB 1100, or a dual in-line memory module (DIMM) in which the semiconductor packages 1200 are arranged in both surfaces of the PCB 1100. Furthermore, the memory module 1000 may be a fully buffered DIMM (FBDIMM) including an advanced memory buffer (AMB) that provides external signals to each of the semiconductor packages 1200.

Figure 20:
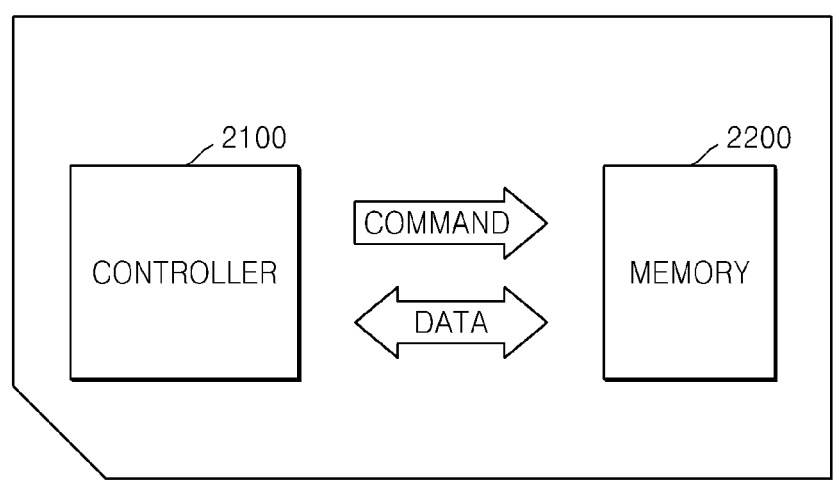
FIG. 20 is a schematic view of a memory card including a semiconductor device including an electrode structure, according to an exemplary embodiment.

FIG. 20 is a schematic view of a memory card 2000 including a semiconductor device including an electrode structure, according to an exemplary embodiment.

Specifically, the memory card 2000 may be disposed in such a way that a controller 2100 and a memory 2200 can exchange electrical signals. For example, if the controller 2100 sends a command to the memory 2200, the memory 2200 can transmit data.

The memory 2200 may include the semiconductor device including the electrode structure according to the various disclosed embodiments.

The memory card 2000 may include various types of memory cards, for example, a memory stick card, a smart media card (SM), a secure digital card (SD), a mini-secure digital card (mini SD), a multimedia card (MMC), and the like.

Figure 21:
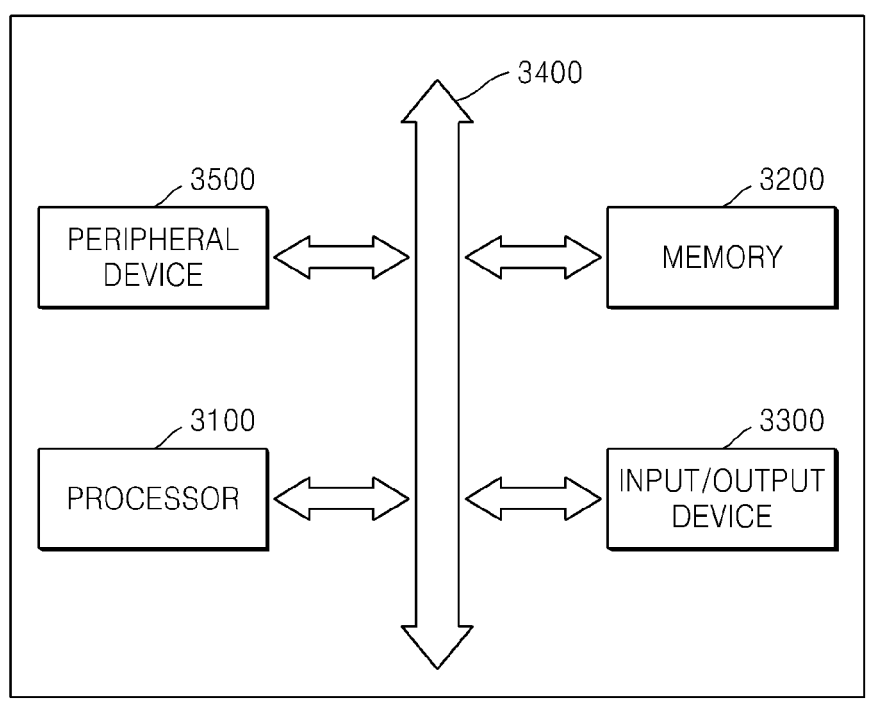
FIG. 21 is a schematic view of a system including a semiconductor device including an electrode structure, according to an exemplary embodiment.

FIG. 21 is a schematic view of a system 3000 including a semiconductor device including an electrode structure, according to an exemplary embodiment.

Specifically, the system 3000 may communicate data using a processor 3100, a memory 3200, an input/output device 3300, and a bus 3400. The memory 3200 of the system 3000 may include, for example, a random access memory (RAM) and a read only memory (ROM). The system 300 may further include a peripheral device 3500 such as a floppy disk drive or a compact disk (CD) ROM drive.

The memory 3200 may include the semiconductor device including the electrode structure according to the disclosed embodiments.

The memory 3200 may store a code and data for operating the processor 3100. The system 3000 may be used, for example, in a mobile phone, an MP3 player, a navigation system, a portable multimedia player (PMP), a solid state disk (SSD), or a household appliance.

While the inventive concept has been particularly shown and described with reference to exemplary embodiments thereof, it will be understood that various changes in form and details may be made therein without departing from the spirit and scope of the following claims.

What is claimed is:

1. A method of fabricating an electrode structure, the method comprising:
    forming a polysilicon layer doped with resistance adjustment impurities on a semiconductor substrate, the polysilicon layer including a first polysilicon layer including the resistance adjustment impurities as the only impurities;
    forming a second polysilicon layer for adjusting grains and doped with grain adjustment impurities in the polysilicon layer doped with the resistance adjustment impurities;
    forming a barrier metal layer on the second polysilicon layer; and
    forming a metal layer on the barrier metal layer,
    wherein the second polysilicon layer is formed on the first polysilicon layer by an in-situ process with respect to the first polysilicon layer including depositing a precursor including one or more of carbon, nitrogen, and oxygen as grain adjustment impurities;
    wherein after the step of the forming the first polysilicon layer, the step of forming the second polysilicon layer is performed thereafter without performing intermediate steps on the first polysilicon layer.

2. The method of claim 1, wherein the second polysilicon layer is formed by doping one or more of carbon, nitrogen, and oxygen through an epitaxial growth process.

3. The method of claim 1, wherein the grain adjustment impurities are a different type of impurity from the resistance adjustment impurities.

4. The method of claim 1, further comprising:
    forming the first polysilicon layer to include grains having a first grain size; and
    forming the second polysilicon layer to include grains having a second grain size lower than the first grain size.

5. The method of claim 4, further comprising:
    as a result of the lower grain size in the second polysilicon layer, forming the ohmic metal layer to have a reduced thickness.

6. The method of claim 4, further comprising:
    as a result of the lower grain size in the second polysilicon layer, preventing resistance adjustment impurities from diffusing over to a gate insulation layer.

7. The method of claim 1, wherein, as a result of the grain adjustment impurities, an average grain size of grains in the second polysilicon layer is less than 50% of the average grain size of grains in the first polysilicon layer.

8. A method of fabricating an electrode structure, the method comprising:
    forming a polysilicon layer doped with resistance adjustment impurities on a semiconductor substrate, the polysilicon layer including a first polysilicon layer including the resistance adjustment impurities as the only impurities;
    forming a second polysilicon layer for adjusting grains and doped with grain adjustment impurities in the polysilicon layer doped with the resistance adjustment impurities;
    forming an ohmic metal layer on the second polysilicon layer;
    forming a barrier metal layer on the ohmic metal layer; and
    forming a metal layer on the barrier metal layer,
    wherein the second polysilicon layer is formed on the first polysilicon layer by in-situ depositing a precursor including one or more of carbon, nitrogen, and oxygen as grain adjustment impurities,
    wherein, as a result of the grain adjustment impurities, a thickness of the ohmic metal layer is reduced by at least 25% compared to if the grain adjustment impurities had not been included in the second polysilicon layer.

9. The method of claim 1, wherein the resistance adjustment impurities include at least one of phosphorus, arsenic, or boron, and the grain adjustment impurities include at least one of oxygen, nitrogen, or carbon.

10. A method of fabricating an electrode structure, the method comprising:
    depositing a first polysilicon layer doped with impurities on a semiconductor substrate;
    depositing a second polysilicon layer doped with one or more of carbon, nitrogen, and oxygen on the first polysilicon layer;
    forming an ohmic layer on the second polysilicon layer;
    forming a barrier layer on the ohmic layer; and
    forming a metal layer on the barrier layer,
    wherein after forming the first polysilicon layer, depositing of the second polysilicon layer is performed by an in-situ process with respect to the first polysilicon layer,
    wherein after the step of the forming the first polysilicon layer, the step of forming the second polysilicon layer is performed thereafter without performing intermediate steps on the first polysilicon layer.

11. The method of claim 10, wherein the ohmic layer is deposited directly on the second polysilicon layer.

12. The method of claim 10, wherein the ohmic layer comprises tungsten silicide layer.

13. A method of fabricating an electrode structure, the method comprising:
    forming a polysilicon layer doped with resistance adjustment impurities on a semiconductor substrate, the polysilicon layer including a first polysilicon layer including the resistance adjustment impurities as the only impurities;
    forming a second polysilicon layer for adjusting grains and doped with grain adjustment impurities in the polysilicon layer doped with the resistance adjustment impurities;

forming a barrier metal layer on the second polysilicon layer;

forming a metal layer on the barrier metal layer;

forming an ohmic metal layer on the second polysilicon layer; and forming the barrier metal layer on the ohmic metal layer, wherein the second polysilicon layer is formed on the first polysilicon layer by an in-situ process with respect to the first polysilicon layer including depositing a precursor including one or more of carbon, nitrogen, and oxygen as grain adjustment impurities.

14. The method of claim 1, wherein after the step of forming the first polysilicon layer, the step of forming the second polysilicon layer is performed with the in-situ process without the semiconductor substrate being removed from a place where the first polysilicon layer is deposited.

15. The method of claim 8, wherein after the step of the forming the first polysilicon layer, the step of forming the second polysilicon layer is performed without the semiconductor substrate being removed from a place where the first polysilicon layer is deposited.

16. The method of claim 10, wherein after the step of the forming the first polysilicon layer, the step of forming the second polysilicon layer is performed with the in-situ process without the semiconductor substrate being removed from a place where the first polysilicon layer is deposited.

* * * * *